United States Patent
Nefzi et al.

(10) Patent No.: US 11,526,089 B2
(45) Date of Patent: Dec. 13, 2022

(54) COMPENSATION OF CREEP EFFECTS IN AN IMAGING DEVICE

(71) Applicant: Carl Zeiss SMT GmbH, Oberkochen (DE)

(72) Inventors: Marwène Nefzi, Ulm (DE); Stefan Hembacher, Bobingen (DE); Stefan Troeger, Ulm (DE); Ralf Zweering, Aalen (DE); Konrad Carl Steimer, Mannheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 58 days.

(21) Appl. No.: 17/354,204

(22) Filed: Jun. 22, 2021

(65) Prior Publication Data
US 2021/0405543 A1    Dec. 30, 2021

(30) Foreign Application Priority Data
Jun. 29, 2020 (DE) .................... 10 2020 208 009.7

(51) Int. Cl.
*G03F 7/20* (2006.01)
(52) U.S. Cl.
CPC ................................ *G03F 7/70725* (2013.01)
(58) Field of Classification Search
CPC .. G03F 7/70725; G03F 7/70258; G03F 7/709; G03F 7/70825; G02B 7/1822
See application file for complete search history.

(56) References Cited

U.S. PATENT DOCUMENTS

| 6,036,162 A | 3/2000 | Hayashi |
| 10,209,634 B2 * | 2/2019 | Butler ................. G03F 7/70725 |
| 10,386,732 B2 | 8/2019 | Marsollek |
| 11,029,612 B2 * | 6/2021 | Kimman ............... F16C 39/063 |
| 11,415,895 B2 | 8/2022 | Nefzi |

(Continued)

FOREIGN PATENT DOCUMENTS

| DE | 10 2008 032 853 A1 | 1/2010 |
| DE | 10 2016 208 008 A1 | 11/2017 |

(Continued)

OTHER PUBLICATIONS

German Office Action, with translation thereof, for corresponding DE Appl No. 10 2020 208 009.7, dated Jan. 26, 2021.

(Continued)

*Primary Examiner* — Hung V Nguyen
(74) *Attorney, Agent, or Firm* — Fish & Richardson P.C.

(57) ABSTRACT

An arrangement of a microlithographic optical imaging device includes first and second supporting structures. The first supporting structure supports an optical element of the imaging device. The first supporting structure supports the second supporting structure via supporting spring devices of a vibration decoupling device. The supporting spring devices act kinematically parallel to one another between the first and second supporting structures. Each of the supporting spring devices defines a supporting force direction and a supporting length along the supporting force direction. The second supporting structure supports a measuring device which measures the position and/or orientation of the at least one optical element in relation to a reference in at least one degree of freedom up to all six degrees of freedom in space. A reduction device reduces a change in a static relative situation between the first and second supporting structures in at least one correction degree of freedom.

22 Claims, 3 Drawing Sheets

(56) References Cited

U.S. PATENT DOCUMENTS

| | | |
|---|---|---|
| 2005/0105069 A1 | 5/2005 | Loopstra et al. |
| 2008/0240501 A1 | 10/2008 | Van Der Wijst et al. |
| 2010/0124724 A1 | 5/2010 | Hoshino |
| 2010/0134770 A1 | 6/2010 | Okamoto |
| 2011/0170078 A1 | 7/2011 | Loopstra et al. |
| 2011/0299053 A1 | 12/2011 | Steinbach et al. |
| 2012/0105819 A1 | 5/2012 | Butler |
| 2015/0235887 A1 | 8/2015 | Van Lievenoogen et al. |
| 2017/0329238 A1 | 11/2017 | Schoenhoff et al. |
| 2019/0079417 A1 | 3/2019 | Marsollek |
| 2020/0124991 A1 | 4/2020 | Butler |
| 2021/0405358 A1 | 12/2021 | Knauf et al. |
| 2021/0405359 A1 | 12/2021 | Knauf et al. |
| 2021/0405542 A1 | 12/2021 | Nefzi et al. |

FOREIGN PATENT DOCUMENTS

| | | |
|---|---|---|
| DE | 10 2017 207 433 A1 | 4/2018 |
| DE | 10 2018 200 528 A1 | 12/2018 |
| WO | WO 2018/015079 A1 | 1/2018 |
| WO | WO 2018/141520 A1 | 8/2018 |
| WO | WO 2018/166745 A1 | 9/2018 |
| WO | WO 2018/192759 A1 | 10/2018 |

OTHER PUBLICATIONS

U.S. Appl. No. 17/354,116, filed Jun. 22, 2021, Eylem Bektas Knauf.

U.S. Appl. No. 17/354,212, filed Jun. 22, 2021, Eylem Bektas Knauf.

European Search Report for corresponding EP Appl No. 21 17 4906.4, dated Feb. 9, 2022.

Reiser et al., PIRest Technology—How to Keep the Last Position of PZT Actuators without Electrical Power, Actuator 2018: 16th International Conference on New Actuators, Bremen, Germany, Jun. 25-27, 2018 (Year: 2018).

U.S. Appl. No. 17/354,160, filed Jun. 22, 2021, Marwène Nefzi.

\* cited by examiner

COMPENSATION OF CREEP EFFECTS IN AN IMAGING DEVICE

CROSS-REFERENCE TO RELATED APPLICATIONS

This application claims priority under 35 U.S.C. § 119 to German patent application No. 10 2020 208 009.7, filed Jun. 29, 2020, the entire contents of which are incorporated by reference herein.

FIELD

The present disclosure relates to a microlithographic optical arrangement suitable for utilizing UV used light, such as light in the extreme ultraviolet (EUV) range. Furthermore, the disclosure relates to an optical imaging device including such an arrangement. The disclosure can be used in conjunction with any desired optical imaging methods, such as in the production or the inspection of microelectronic circuits and the optical components used for them (for example optical masks).

BACKGROUND

The optical devices used in conjunction with the production of microelectronic circuits typically include a plurality of optical element units including one or more optical elements, such as lens elements, mirrors or optical gratings, which are arranged in the imaging light path. The optical elements typically cooperate in an imaging process in order to transfer an image of an object (for example a pattern formed on a mask) to a substrate (for example a so-called wafer). The optical elements are typically combined in one or more functional groups held, if appropriate, in separate imaging units. In the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically include a supporting structure having a substantially ring-shaped outer supporting unit, which supports one or more optical element holders, the latter in turn holding the optical element.

The ever-advancing miniaturization of semiconductor components generally results in a constant demand for increased resolution of the optical systems used for their production. This demand for increased resolution can cause a demand for an increased numerical aperture (NA) and an increased imaging accuracy of the optical systems.

One approach for obtaining an increased optical resolution involves reducing the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In this EUV range it is generally no longer possible to use conventional refractive optical systems. This is owing to the fact that in this EUV range the materials used for refractive optical systems generally have an absorbance that is too high to achieve acceptable imaging results with the available light power. Consequently, in this EUV range it is usually desirable to use reflective optical systems for the imaging.

This transition to purely reflective optical systems having a high numerical aperture (e.g. NA>0.4) in the EUV range can present considerable challenges with regard to the design of the imaging device.

The factors mentioned above can result in very stringent desired properties with regard to the position and/or orientation of the optical elements participating in the imaging relative to one another and also with regard to the deformation of the individual optical elements in order to achieve a desired imaging accuracy. Moreover, it is generally desirable to maintain this high imaging accuracy over operation in its entirety, ultimately over the lifetime of the system.

As a consequence, it is desirable for the components of the optical imaging device (for example, the optical elements of the illumination device, the mask, the optical elements of the projection device and the substrate) which cooperate during the imaging to be supported in a well-defined manner in order to maintain a predetermined well-defined spatial relationship between these components and to obtain a minimal undesired deformation of these components in order ultimately to achieve the highest possible imaging quality.

A challenge in this case often relates to undertaking the most precise possible measurement of the situation (i.e., the position and/or orientation) of the optical components (e.g., the optical elements) involved in the imaging and actively setting the situation of at least some of these optical elements by way of an appropriately controlled situation control device with the precision (typically in the region of 1 nm or less) and control bandwidth (typically up to 200 Hz) used for the imaging process. In this case, a factor for the precision of the measurement is often the stable and precise support of the measuring device used for the measurement. Where possible, it is desirable for this support to ensure that the components of the measuring device have a well-defined situation (i.e., position and/or orientation) in relation to a defined reference to which the measurement result of the measuring device is related.

An option frequently used in this context is that of supporting the measuring device on a separate supporting structure, which is often also referred to as metrology frame or sensor frame. In this case, such a metrology frame is typically supported on a further (single-part or multi-part) load-bearing structure ("force frame") which, in addition to the metrology frame, also supports at least some of the optical components (e.g., at least some of the optical elements) of the imaging device via the situation control device. This can ensure that the metrology frame can be kept largely clear from the support loads for the optical components.

To keep the metrology frame relatively free from internal disturbances of the imaging device (e.g., vibrations induced by moving components) and external disturbances (e.g., unwanted shocks) in this case, the metrology frame is frequently supported on the load-bearing structure in vibration-isolated or vibration-decoupled fashion by way of a vibration decoupling device. Typically, this is implemented by way of a plurality of supporting spring devices of the vibration decoupling device.

While this can achieve good dynamic vibration isolation of the metrology frame (on short time scales), it was found that so-called creep effects or settling effects can arise in the area of the vibration decoupling device, for example in the area of the supporting spring devices, over long time scales. As a result of this, there can be, in the long term, a change in the situation of the metrology frame and hence a change in the situation of the reference used for controlling the situation control device relative to the load-bearing structure. However, creep or settling effects (which, for simplification purposes, are simply subsumed by the term "creep effects" below) may also occur in any other supporting concepts without such vibration decoupling devices or supporting spring devices. Such a change in the situation of the reference is typically compensated for by the situation control device during operation; however, it is desired that the latter provides sufficient travel to this end, and consequently a sufficient movement reserve, and accordingly has a correspondingly relatively complicated or relatively expensive design.

SUMMARY

The disclosure seeks to provide a microlithographic optical arrangement and a corresponding optical imaging device including such an arrangement, and a corresponding method, which do reduce, and possibly avoid, limitations of known technology, and, for example, facilitate optical imaging with the highest possible imaging quality in the simplest and most cost-effective manner.

The disclosure involves the technical teaching that optical imaging with a high imaging quality can be easily and cost effectively obtained if a magnetic device is provided which acts kinematically parallel to the supporting spring devices between the load-bearing first supporting structure and the second supporting structure bearing the measuring device. The magnetic device exerts a magnetic supporting force counteracting the change in the relative situation. Here, it is easily possible to exploit the circumstance that the magnetic supporting force, which is produced by the repulsion of two magnets, for example, increases over-proportionally with increasing proximity of the magnets.

A change in the relative situation of the two supporting structures can therefore be counteracted in a simple and passive manner by a greatly increasing resistance from the magnetic supporting force, which significantly reduces the extent of the change in the relative situation overall. Likewise, the magnetic supporting force, however, can also obtain substantial relief of the supporting spring devices, as a result of which creep or settling effects in the area of the supporting spring devices may be significantly reduced.

In the sense of the present disclosure, the term "static change in the relative situation" should be understood to mean that this is the change in the relative situation or a drift between the first supporting structure and the second supporting structure, which is present in the purely static state, i.e., without dynamic excitation of the structures. As will be explained in more detail below, such a static change in the relative situation or drift can be detected by way of suitable methods which filter out short-term or dynamic influences. By way of example, there can be simple averaging of the relative situation information over suitably long periods of time.

In the case of conventional designs, depending on the extent of the static change in the relative situation, there can be a comparatively pronounced static (or non-dynamic) deflection of the relative situation control device and hence of the optical elements from their original initial relative situation by which this change in relative situation is compensated for, hence, by which the optical elements follow this change in the relative situation. This can go so far that the relative situation control device is no longer able to supply the travel involved for the dynamic relative situation control of the optical elements during operation since it reaches its limits in this respect.

In conventional designs, this conflict is solved by virtue of the relative situation control device being designed with a correspondingly large range of motion, which allows it to react accordingly over the service life of the imaging device. However, this is linked to comparatively high costs since a displacement motion with correspondingly high dynamics, for example, can only be realized with comparatively great outlay. The part of the dynamic range of motion of the relative situation control device, by which the optical elements are adjusted to follow the static change in relative situation, is thus ultimately wasted from a costs point of view.

By contrast, using the present magnetic compensation, it is easily possible to at least significantly reduce the relative deflection of the second supporting structure, and hence of the reference, by way of a simple, possibly purely passive approach even during a specified relatively long period of operation, over which creep or settling effects in the support of the second supporting structure may have had a noticeable effect. If the magnetic device is designed to be active at least intermittently (for example in such a way that its supporting force can be actively increased, for example by increasing the magnetization), the second supporting structure, and hence the reference, may even be returned to (or to the vicinity of) its initial state, which it had following an initial adjustment of the imaging device (typically immediately during the first-time start-up of the imaging device). As a consequence, even the relative situation control device, which follows the reference, or the optical elements carried by the relative situation control device are then returned back to their initial state. A drift of the relative situation control device is consequently largely reduced in the passive case and even at least substantially removed in the active case.

As a result, it is possible, for example in a simple manner, to keep the maximum desired or possible travel of the relative situation control device relatively small or restricted to the bare minimum. For example, there is no need to keep a large motion reserve for the compensation of long-term creep or settling effects. This motion reserve can be kept significantly smaller.

According to one aspect, the disclosure relates to an arrangement of a microlithographic optical imaging device, for example for using light in the extreme UV (EUV) range, including a first supporting structure and a second supporting structure, wherein the first supporting structure is configured to support at least one optical element of the imaging device. The first supporting structure supports the second supporting structure by way of a supporting device. The second supporting structure supports a measuring device which is configured to measure the position and/or orientation of the at least one optical element in relation to a reference, for example a reference of the second supporting structure, in at least one degree of freedom up to all six degrees of freedom in space. Provision is made of a reduction device for reducing a change in a static relative situation between the first supporting structure and the second supporting structure in at least one correction degree of freedom. The reduction device includes a magnetic device acting kinematically parallel to the supporting device between the first supporting structure and the second supporting structure, the magnetic device being configured to exert a magnetic supporting force that counteracts the change in the relative situation.

Here, in general, the supporting device can have any design. For example, it can be an active (i.e., actively adjustable) or passive supporting device. The first supporting structure can support the second supporting structure, for example by way of a plurality of supporting units which act kinematically parallel to one another between the first supporting structure and the second supporting structure. In some embodiments, the first supporting structure supports the second supporting structure by way of a plurality of supporting spring devices of a vibration decoupling device of the supporting device, wherein the supporting spring devices act kinematically parallel to one another between the first supporting structure and the second supporting structure. In this case, each of the supporting spring devices can define a supporting force direction, in which they exert a supporting force between the first supporting structure and the second supporting structure, and a supporting length along the supporting force direction. The change in relative situation may then be brought about by a change in the length of at least one of the supporting spring devices along its supporting force direction, which arises from a creep process of the supporting spring device. The magnetic device then acts kinematically parallel to the supporting spring devices between the first supporting structure and the second supporting structure. The reduction device can then also be called a creep reduction device.

In general, the magnetic device can have any design and can exert a magnetic supporting force of arbitrary strength, which is matched to the force of the supporting spring devices. Thus, it may be possible for the magnetic supporting force to absorb a large proportion of the overall weight of the second supporting structure and of the components carried by the second supporting structure such that there is a significantly lower load on the supporting spring devices (thus, they may optionally even only need to be able to absorb the dynamic loads), as a result of which creep and settling effects can be reduced. Optionally, the magnetic device is configured in such a way that it absorbs at least a fraction of the overall weight of the second supporting structure and of the components carried by the second supporting structure. This fraction can have any value. Optionally, the fraction is at least 0.5% to 20% (e.g., at least 1% to 15%, at least 2% to 5%) of the overall weight. It is possible to obtain variants, for example from dynamic points of view.

In some embodiments, the magnetic device includes at least one magnetic unit pair composed of two magnetic units assigned to one another, which interact in contactless fashion at least in the direction of the magnetic supporting force for the purposes of generating the magnetic supporting force. Here, a first magnetic unit of a magnetic unit pair can be mechanically connected to the first supporting structure and a second magnetic unit of the magnetic unit pair can be mechanically connected to the second supporting structure. Furthermore, in certain embodiments, the magnetic units of at least one magnetic unit pair can be configured and arranged in such a way that their contribution to the magnetic supporting force is implemented by way of a mutual repulsion of the two magnetic units. In certain embodiments, the magnetic units of at least one of the magnetic unit pairs can be configured and arranged in such a way that their contribution to the magnetic supporting force is implemented by way of a mutual attraction of the two magnetic units. It is possible to realize relatively simple designs in each case. It will be appreciated that the aforementioned embodiments (with attraction and repulsion) can be combined as desired.

In general, the magnetic device or its at least one magnetic unit pair, respectively, can be functionally assigned, for example spatially assigned, in any suitable manner to the supporting device (for example, to one or more supporting units or supporting spring devices). Optionally, this assignment is naturally matched to an expected creep or settling behavior of the supporting device (for example, of one or more supporting units or supporting spring devices). It can be desirable for at least one magnetic unit pair to be functionally assigned, for example spatially assigned, to the supporting device (for example, at least one or more supporting units or supporting spring devices). Relatively simple matching with simple needs-based compensation of creep or settling effects is possible, for example, if at least one magnetic unit pair, for example exactly one magnetic unit pair, is functionally assigned to each one of a plurality of the supporting units of the supporting spring devices, for example to each of the supporting units or supporting spring devices.

As already mentioned, it is generally possible to use active magnetic unit pairs, the magnetic supporting force of which can be actively altered or set at least intermittently. Relatively simple configurations, passive in this respect, however can emerge if at least one magnetic unit of the magnetic device includes at least one permanent magnet. Here, in relatively simple cases, the two magnetic units of a magnetic unit pair of the magnetic device can each include at least one permanent magnet. Such configurations can have a relatively simple design and an over-proportional course of the magnetic supporting force as a function of the distance of the two magnetic units. In embodiments, at least one first magnetic unit of a magnetic unit pair of the magnetic device can include a plurality of permanent magnets, the magnetic fields of which being superposed on one another in such a way that, in the direction of the contribution to the magnetic supporting force generated by the magnetic unit pair, a magnetic supporting force acts over a specifiable motion section on a second magnetic unit of a magnetic unit with a specifiable profile.

Here, a substantially constant magnetic force can be realized, for example over a specifiable motion section. In this case, the magnetic unit pair then can have a stiffness at least close to zero, which may be desirable from dynamic points of view since the dynamic vibration decoupling behavior then is, in this respect, defined primarily or even exclusively by way of the supporting spring devices, for example.

In certain embodiments, provision can be made for the magnetic device to be configured in such a way that the magnetic supporting force, at least section-wise proportionately increases with increasing change in relative situation. For example, the magnetic device can be configured in such a way that the magnetic supporting force at least section-wise over-proportionately increases with increasing change in relative situation. Naturally, both embodiments can be matched to the supporting spring devices and lead to the reduction in the static relative deflection already described above.

In general, the at least one magnetic unit of the magnetic device can be designed in such a way that it itself already provides the desired decoupling in the decoupling degrees of freedom involved (for the support of the second supporting structure). In embodiments, during operation the at least one magnetic unit of the magnetic device exerts a magnetically generated supporting force in a supporting force direction on one of the supporting structures, wherein the at least one magnetic unit is mechanically connected to one of the supporting structures, for example to the second supporting structure, by way of a decoupling device. Then, the decoupling device can be configured to generate at least partial mechanical decoupling between the magnetic unit and the supporting structure in at least one decoupling degree of freedom that differs from the supporting force direction. Here, the at least one decoupling degree of freedom can be a translational degree of freedom which extends transversely to the supporting force direction. In addition or as an alternative thereto, the at least one decoupling degree of freedom can be a rotational degree of freedom about an axis which extends transversely to the supporting force direction. A vibration decoupling can be obtained in a simple manner in all these cases.

In certain embodiments that can be relatively easy to realize, during operation the at least one magnetic unit of the magnetic device exerts a magnetically generated supporting force in a supporting force direction on one of the supporting structures, wherein the at least one magnetic unit is mechanically connected to the supporting structure by way of a decoupling device, which extends in the supporting force direction. In this case, the decoupling device can include a flexible decoupling element that is elongated in the supporting force direction in order to achieve the decoupling in a simple manner. In addition or as an alternative thereto, the decoupling device can include a leaf spring element that is elongated in the supporting force direction in order to achieve the decoupling in a simple manner. In addition or as an alternative thereto, the decoupling device can include a narrow, for example flexible, rod spring element that is elongated in the supporting force direction in order to achieve the decoupling in a simple manner.

In some embodiments, a control device is provided, which is configured to control the magnetic device to change the magnetic supporting force on the basis of a change in state of the supporting device, for example on the basis of a change in length of at least one supporting spring device of the supporting device along its supporting force direction. Here, for the purposes of ascertaining the change in state, the control device can use a change of state model, for example a time-dependent change of state model, which describes the change in situation behavior of the supporting device. By way of example, for the purposes of ascertaining the change in length of the at least one supporting spring device along its supporting force direction, the control device can use a creep model, for example a time-dependent creep model, of the supporting spring device, which describes the creep behavior of the supporting spring device.

In certain embodiments, provision is made of a detection device and a control device, wherein the detection device is configured to detect at least one relative situation detection value, which is representative for the relative situation between the first supporting structure and the second supporting structure in at least one correction degree of freedom, and to output the relative situation detection value to the control device. In a creep compensation mode, the control device can be configured to control the magnetic device to change the magnetic supporting force, on the basis of the relative situation detection value, for example on the basis of a change in the relative situation detection value over time.

In general, changing the magnetic supporting force in the compensation mode can be implemented at any suitable time or triggered by any temporal events (e.g., specifiable intervals) and/or non-temporal events (e.g., detected shock loads, reaching a certain number of imaging procedures, starting up or shutting down the imaging device, etc.).

In certain embodiments, the control device is configured to activate the creep compensation mode if a relative situation change represented by relative situation change information or a relative situation detection value exceeds a specifiable limit value. As a result of this, it is naturally possible to react relatively efficiently and in needs-based fashion to the creep or settling effects.

Additionally or alternatively, the control device can be configured to activate the creep compensation mode on the basis of specifiable events, for example at specifiable time intervals, wherein the creep compensation mode is activated, for example, 0.25 to 10 years (e.g., 0.5 to 5 years, 1 to 2 years) following the first operation of the imaging device and/or a preceding activation of the creep compensation mode.

In general, the control device can be designed in any suitable manner in order to realize a control of the magnetic device that is adapted to the respective optical imaging process. It is possible, i for example, to provide any suitable control bandwidths for controlling the supporting device. In some embodiments, the control device has a control bandwidth of 10 Hz to 1000 Hz (e.g., 20 Hz to 500 Hz, 50 Hz to 300 Hz).

The degree of freedom or the degrees of freedom in which there is a change in relative situation relevant to the imaging process or the imaging errors thereof as a result of creep or settling effects and which are counteracted by the (passive or active) magnetic device can be any degrees of freedom, up to all six degrees of freedom in space. Here, in the case of an active solution, any suitable limit values can be specified, which, when exceeded, involve or trigger the change in the magnetic supporting force.

In certain embodiments, the at least one degree of freedom of the change in relative situation is a rotational degree of freedom, for example a rotational degree of freedom about a tilt axis extending transversely to the direction of gravity. The specifiable limit value then can representative for a deviation of the relative situation between the first supporting structure and the second supporting structure from a specifiable relative target situation by 1 μrad to 500 μrad (e.g., 10 μrad to 300 μrad, 20 μrad to 100 μrad). In addition or as an alternative thereto, the at least one degree of freedom of the change in relative situation can be a translational degree of freedom, for example a translational degree of freedom along the direction of gravity. The specifiable limit value then can be representative for a deviation of the relative situation between the first supporting structure and the second supporting structure from a specifiable relative target situation by 1 μm to 500 μm (e.g., 10 μm to 300 μm, 20 μm to 100 μm).

The present disclosure also relates to an optical imaging device, for example for microlithography, including an illumination device including a first optical element group, an object device for receiving an object, a projection device including a second optical element group and an image device, wherein the illumination device is configured to illuminate the object and the projection device is configured to project an image of the object onto the image device. The illumination device and/or the projection device includes at least one arrangement according to the disclosure. This makes it possible to realize the embodiments and features described above to the same extent, and so reference is made to the explanations given above in this respect.

The present disclosure furthermore relates to a method for a microlithographic optical imaging device, for example for using light in the extreme UV (EUV) range, wherein a first supporting structure supports a second supporting structure by way of a supporting device and is configured to support at least one optical element of the imaging device. The second supporting structure supports a measuring device which is configured to measure the position and/or orientation of the at least one optical element in relation to a reference, for example a reference of the second supporting structure, in at least one degree of freedom up to all six degrees of freedom in space. In a compensation step, a change in a static relative situation between the first supporting structure and the second supporting structure in at least one degree of freedom is at least reduced by virtue of a magnetically generated magnetic supporting force which counteracts the change in relative situation and is exerted kinematically parallel to the supporting device between the first supporting structure and the second supporting structure. This likewise makes it possible to realize the embodiments and features described above to the same extent, and so reference is made to the explanations given above in this respect.

Further aspects and exemplary embodiments of the disclosure are evident from the dependent claims and the following description of exemplary embodiments, which relates to the accompanying figures. All combinations of the disclosed features, irrespective of whether or not they are the subject of a claim, lie within the scope of protection of the disclosure.

DETAILED DESCRIPTION OF EXEMPLARY EMBODIMENTS

Exemplary embodiments of an optical imaging device according to the disclosure in the form of a microlithographic projection exposure apparatus 101, which include exemplary embodiments of an optical arrangement according to the disclosure, are described below with reference to FIGS. 1 to 8. To simplify the following explanations, an x, y, z coordinate system is indicated in the drawings, the z direction running counter to the direction of gravitational force. It goes without saying that it is possible in further configurations to choose any desired other orientations of an x, y, z coordinate system.

Figure 1:
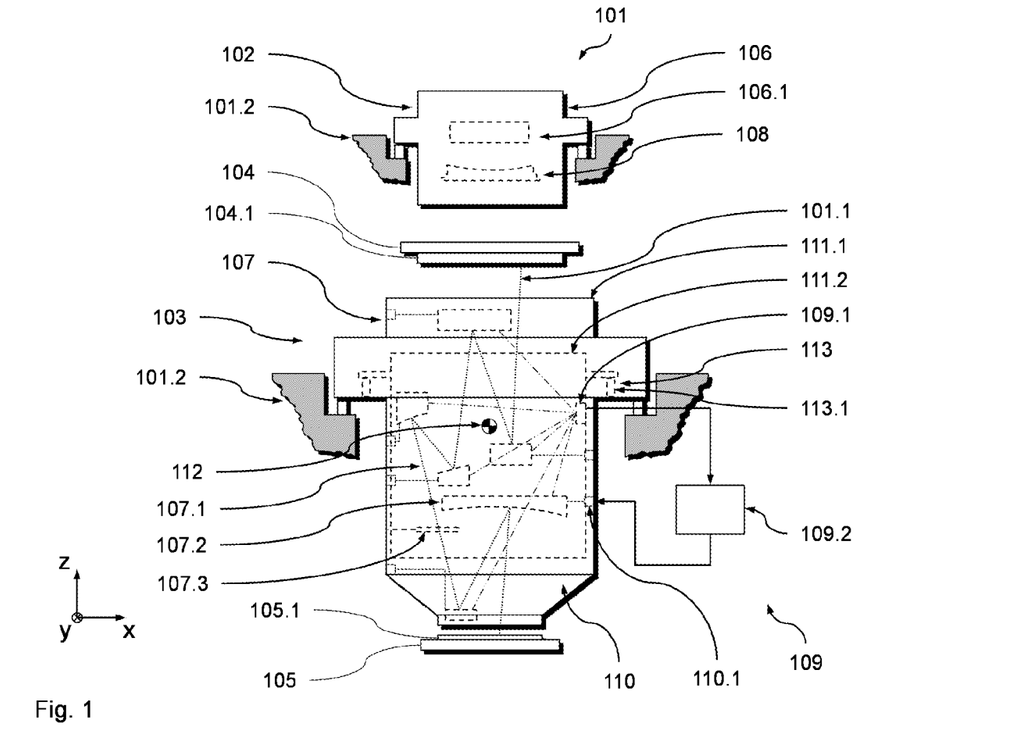
FIG. 1 is a schematic illustration of an embodiment of an optical imaging device according to the disclosure, which includes an embodiment of an optical arrangement according to the disclosure.

FIG. 1 is a schematic, not-to-scale representation of the projection exposure apparatus 101, which is used in a microlithographic process for producing semiconductor components. The projection exposure apparatus 101 includes an illumination device 102 and a projection device 103. The projection device 103 is configured to transfer, in an exposure process, an image of a structure of a mask 104.1, which is disposed in a mask unit 104, onto a substrate 105.1, which is disposed in a substrate unit 105. For this purpose, the illumination device 102 illuminates the mask 104.1. The optical projection device 103 receives the light from the mask 104.1 and projects the image of the mask structure of the mask 104.1 onto the substrate 105.1, such as for example a wafer or the like.

The illumination device 102 includes an optical unit 106 including an optical element group 106.1. The projection device 103 includes a further optical unit 107 including an optical element group 107.1. The optical element groups 106.1, 107.1 are disposed along a folded central ray path 101.1 of the projection exposure apparatus 101. Each optical element group 106.1, 107.1 can include an arbitrary plurality of optical elements.

In the present embodiment, the projection exposure apparatus 101 operates with used light in the EUV range (extreme ultraviolet radiation), with wavelengths of between 5 nm and 20 nm, for example with a wavelength of 13 nm. The optical elements of the element groups 106.1, 107.1 of the illumination device 102 and the projection device 103 are therefore exclusively reflective optical elements. The optical element groups 106.1, 107.1 may include one or more optical arrangements according to the disclosure, as is described below with reference to the optical arrangement 108. The optical units 106 and 107 are each supported by way of a base structure 101.2.

In further configurations of the disclosure, it is also possible (for example depending on the wavelength of the illumination light), of course, to use any type of optical element (refractive, reflective, diffractive) alone or in any desired combination for the optical modules.

The arrangement according to the disclosure is described in exemplary fashion below with reference to the arrangement 108, which is part of the projection device 103. In the case of the imaging device 101 there are, inter alia, very strict desired properties with respect to the position and/or orientation of the optical elements of the optical element group 107.1 of the projection device 103 relative to one another in order to attain a desired imaging accuracy. Moreover, it is desirable to maintain this high imaging accuracy over operation in its entirety, ultimately over the lifetime of the system.

As a consequence, it is desirable for the optical elements of the optical element group 107.1 to be supported in a well-defined fashion in order to observe a specified well-defined spatial relationship between the optical elements of the element group 107.1 and the remaining optical components and in order thus to ultimately attain the highest possible imaging quality.

To this end, in the present example the relative situation (i.e., the position and/or orientation) of the optical elements of the element group 107.1 is measured using a measuring device 109.1 (illustrated only in greatly simplified fashion in FIG. 1) of a control device 109. The measuring device 109.1 feeds its measurement signals LMS to a control unit 109.2 of the control device 109. On the basis of the measurement signals LMS of the measuring device 109.1, the control unit 109.2 then controls a relative situation control device 110, which is supported on a load-bearing first structure 111.1. Then, by way of the relative situation control device 110, the relative situation of each optical element of the element group 107.1 is actively set with respect to a central reference 112 with the precision (typically in the region of 1 nm and less) and the control bandwidth (typically up to 200 Hz) for the imaging process.

Figure 2:
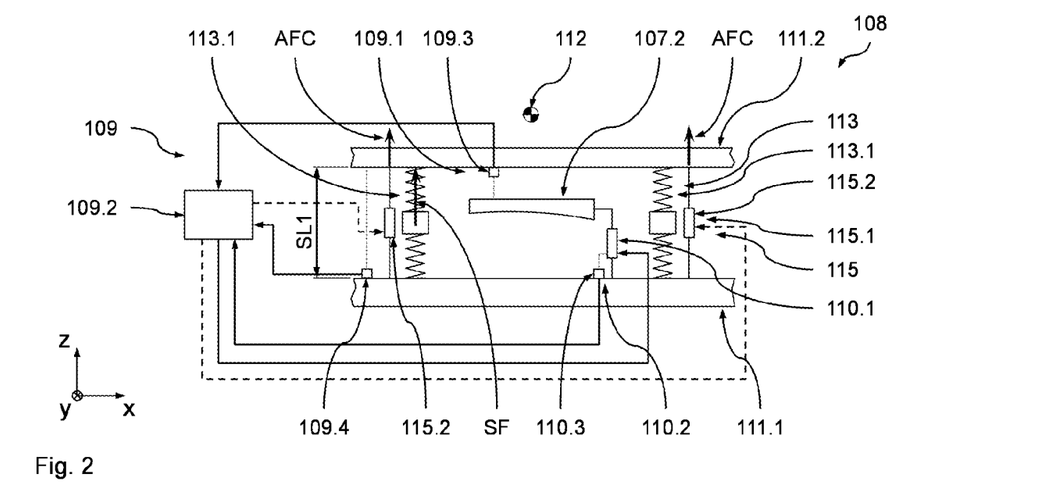
FIG. 2 is a schematic view of part of the imaging device from FIG. 1 in a first state.

In the present example, the measuring device 109.1 outputs to the relative situation control device 110 measurement information MI which is representative of the respective position and/or orientation of the respective optical element of the element group 107.1 in relation to the reference 112 in at least one degree of freedom in space. In the state of the first-time start-up of the imaging device 101 (in which the imaging device 101 is in a first operating state OM1), the control unit 109.2 consequently accordingly controls the relative situation control device 110 on the basis of the measurement information MI in order to generate a first target state Si of the position and/or orientation of the optical elements of the element group 107.1 in relation to the reference 112, as illustrated in FIG. 2 for an optical element 107.2 of the element group 107.1.

A factor for the attainable imaging quality of the imaging device 101 is the precision of the measurement of the measuring device 109.1, which in turn depends on a support of the measuring device 109.1 that is as stable and precise as possible. Where possible, this support should ensure that the components of the measuring device 109.1 have a well-defined relative situation (i.e., position and/or orientation) in relation to the central reference 112 to which the measurement result of the measuring device 109.1 is related.

To this end, the measuring units 109.3 of the measuring device 109.1 are supported on a separate second supporting structure 111.2, which is frequently also referred to as a metrology frame. The metrology frame 111.2 in turn is supported on the (single-part or multi-part) load-bearing first structure 111.1. This can ensure that the metrology frame 111.2 can be kept largely clear from the support loads for the optical elements of the element group 107.1.

To keep the metrology frame 111.2 as free as possible from internal disturbances of the imaging device 101 (e.g., vibrations induced by moving components) and external disturbances (e.g., unwanted shocks), the metrology frame 111.2 is supported on the load-bearing structure 111.1 by way of a supporting device 113. In general, the supporting device 113 can be designed in any suitable way with one or more supporting elements. In the present example, the supporting device is configured in the form of a vibration decoupling device 113, by which the metrology frame 111.2 is supported on the load-bearing structure 111.1 in vibration-isolated or vibration-decoupled fashion. This is implemented by way of a plurality of supporting elements in the form of supporting spring devices 113.1 of the vibration decoupling device 113, wherein the supporting spring devices 113.1 act kinematically parallel to one another between the load-bearing first supporting structure 111.1 and the metrology frame 111.2. Each of the supporting spring devices 113.1 defines a supporting force direction SFR, along which it exerts a supporting force SF between the first supporting structure 111.1 and the second supporting structure 111.2, and defines a supporting length SL1 along the supporting force direction SFR.

Figure 3:
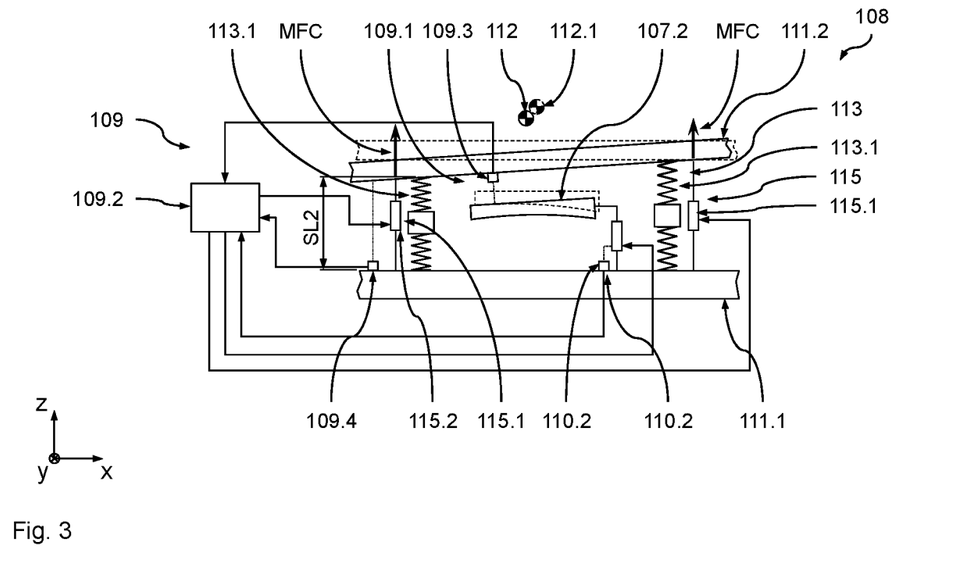
FIG. 3 is a schematic view of the part of the imaging device from FIG. 2 in a second state.
Figure 4:
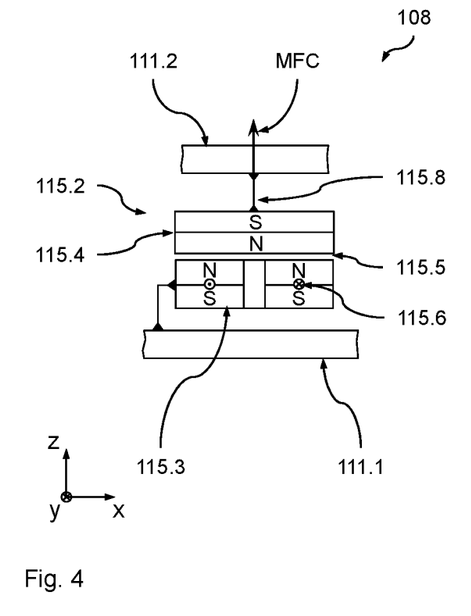
FIG. 4 is a schematic view of the part of an embodiment of the imaging device from FIG. 2.

While this can achieve good dynamic vibration isolation or vibration decoupling of the metrology frame 111.2 from the load-bearing first supporting structure 111.1 (on short time scales), it was found, however, that so-called creep effects or settling effects can arise in the area of the vibration decoupling device 113, for example in the region of the supporting spring devices 113.1, over long time scales. As a result of this, the supporting length of the supporting spring devices 113.1 changes in the long-term (as indicated in FIGS. 3 and 4 by the length SL2) and hence there is a change both in the relative situation of the metrology frame 111.2 and in the relative situation of the reference 112 used for controlling the relative situation control device 110 with respect to the load-bearing structure 111.1 (in relation to the initial relative situation indicated in FIG. 3 by the contour 112.1), as illustrated (in greatly exaggerated fashion) in FIG. 3. In general, such a change in relative situation of the reference 112 can be compensated for by the relative situation control device 110 during normal operation of the imaging device 101 by virtue of the optical elements of the element group 107.1 being adjusted to follow the reference 112 (as illustrated in FIG. 3). However, such a compensation of the change in the situation of the reference 112 by the relative situation control device 110 over the service life of the imaging device 101 would however involve sufficient range, hence a sufficient movement reserve of the relative situation control device 110, as a result of which the latter desirably has a correspondingly complicated or expensive design.

To largely avoid this, a reduction device or compensation device 115 is provided in the present example for the purposes of reducing or at least partly compensating such a change in the static relative situation between the first supporting structure 111.1 and the second supporting structure 111.2 in at least one correction degree of freedom. The reduction device or compensation device 115 includes a passive or actively controllable magnetic device 115.1, which acts kinematically parallel to the supporting spring devices between the first supporting structure and the second supporting structure and which has a series of magnetic unit pairs 115.2, which, where applicable (i.e., in the case of an active design), can be controlled by the control unit 109.2. In the present example, the magnetic device 115.1 exerts a first magnetic supporting force MFT1 on the metrology frame 111.2 in the first mode of operation OM1, the magnetic supporting force being the result of the individual magnetic force contributions MFC of the magnetic unit pairs 115.2. As will still be explained in more detail below, the magnetic supporting force MFT can even possibly be altered on the part of the control unit for the complete compensation of the change in the relative situation.

To this end, in the present example, the control device 109 can capture a relative situation change information RSCI which is representative of a change in the static relative situation between the load-bearing first supporting structure 110.1 and the second supporting structure 110.2 in at least one degree of freedom. The control device 109 has a compensation mode CCM (also referred to as creep compensation mode CCM below), in which the active magnetic device 115.1 then is controlled by the control unit 109.2 in order to change the magnetic force contributions AFC of the active magnetic unit pairs 115.2, and hence the magnetic supporting force MFT, into a second magnetic supporting force MFT2 on the basis of the relative situation change information RSCI. In this case, the second magnetic supporting force MFT2 is chosen in such a way that the metrology frame 111.2 is returned back to the initial state illustrated in FIG. 2. Then, in a second mode of operation OM2 that follows the compensation mode CCM, the active magnetic device 115.1 exerts the second magnetic supporting force MFT2 on the metrology frame 111.2.

It is understood that the control of the magnetic device 115.1 can be realized both as a closed-loop control circuit (in which the relative situation change information RSCI is actually detected by way of appropriate detection signals) and as an open controlled system (in which the relative situation change information RSCI is determined by way of an appropriate model, for example), as this will be explained in more detail below.

Using this correction or compensation, it is possible, for example, in a simple manner to return the metrology frame 111.2, the reference 112 and hence the relative situation control device 110 (and the optical elements of the element group 107.1, for example the optical element 107.2, carried thereby) after a certain relatively long period of operation (over which the creep or settling effects have had a noticeable effect on the support of the second supporting structure 110.2) back to (or to the vicinity of) their initial state, which they had following an initial adjustment of the imaging device (typically immediately during the first-time start-up of the imaging device 101), consequently which they had in the first operating state OM1.

As a result, it is possible, for example, in a simple manner, to keep the maximum possible travel of the relative situation control device 110 relatively small or restricted to the bare minimum. For example, there is no need to keep a large motion reserve for the compensation of long-term creep or settling effects using the relative situation control device 110. This motion reserve can be kept significantly smaller and, for example, be restricted to a value to be expected for the duration of the first mode of operation OM1.

It is understood that the magnetic supporting force MFT can be altered any desired number of times and that it is consequently possible to switch into the creep compensation mode CCM as often as desired. Using this, it is possible to obtain a correspondingly desirable operational behavior over the entire service life of the imaging device 101.

Furthermore, it is possible to obtain a desirable reduction in the change in relative situation in passive embodiments (i.e., embodiments without an active change of the magnetic supporting force) by way of an appropriate design of the magnetic unit pair 115.2. Relatively simple configurations, which are passive in this respect, arise if at least one magnetic unit of the magnetic unit pair 115.2 includes at least one permanent magnet. Here, in relatively simple cases, the two magnetic units of a magnetic unit pair 115.2 of the magnetic device 115.1 can each include at least one permanent magnet. Such configurations are then distinguished by a relatively simple design and an over-proportional profile or course of the magnetic force contribution MFC depending on the distance between the two magnetic units.

In some embodiments, at least a first magnetic unit of a magnetic unit pair of the magnetic device can include a plurality of permanent magnets, the magnetic fields of which are superposed on one another in such a way that, in the direction of the magnetic force contribution MFC to the magnetic supporting force MFT generated by the magnetic unit pair, a magnetic force contribution MFC acts, over a specifiable motion section and with a specifiable profile or course, on a second magnetic unit of a magnetic unit pair 115.2.

Here, a substantially constant magnetic force can be realized, for example over a specifiable motion section. In this case, the magnetic unit pair 115.2 then has a stiffness at least close to zero, which may be desirable from dynamic points of view since the dynamic vibration decoupling behavior then is, in this respect, defined primarily or even exclusively by way of the supporting spring devices 113.1.

In certain embodiments, provision can be made for the magnetic device 115.1 to be configured in such a way that the magnetic supporting force MFT at least section-wise proportionately increases with increasing change in relative situation. For example, the magnetic device 115.1 can be configured in such a way that the magnetic supporting force MFT at least section-wise over-proportionately increases with increasing change in relative situation. Naturally, both embodiments are matched to the supporting spring devices 113.1 and lead to the reduction in the static relative deflection already described above.

In general, in the case of active embodiments, the change in relative situation or the associated relative situation change information RSCI can be determined in any suitable manner. The relative situation control device 110 can include, for example, a deflection detection device 110.2 connected to the control unit 109.2. The deflection detection device 110.2 detects deflection information DI, which is representative for a deflection of the optical element 107.2 in relation to the first supporting structure 111.1 in at least one degree of freedom from the first initial state. The control device 109 then derives the relative situation change information RSCI from the deflection information DI, for example on the basis of a change in the deflection information DI over time.

Thus, the relative situation control device 110 can include a number of relative situation control actuators 110.1 for actively adjusting the optical element 107.2, of which actuators only one relative situation control actuator 110.1 is respectively illustrated in FIGS. 2 and 3 for reasons of clarity. In typical embodiments, provision is made of a plurality of relative situation control actuators 110.1 which act between the first supporting structure 111.1 and the optical element 107.1 in the style of a parallel kinematic system. By way of example, provision can be made of six relative situation control actuators 110.1, which act in the style of a hexapod kinematic system.

By way of example, a deflection detection device 110.2 can detect adjustment information VI, which is representative for an adjustment of the respective relative situation control actuator 110.1 from the adjusted first initial state. The control device 109.1 can then derive the relative situation change information RSCI from the adjustment information VI, for example on the basis of a change in the adjustment information VI over time.

Furthermore, the deflection detection device 110.2 can include at least one adjustment sensor 110.3, which is assigned to the respective relative situation control actuator 110.1. The adjustment sensor 110.3 outputs adjustment sensor information VSI, which is representative for the positioning movement of the relative situation control actuator 110.1, for example a change in length of the relative situation control actuator 110.1. The control device 109 can then derive the adjustment information VI from the adjustment sensor information VSI. It is understood that, in general, any number of adjustment sensors 110.3 can be provided per relative situation control actuator 110.1 in order to determine the adjustment information VI. In the present example, at least two adjustment sensors 110.3 are assigned to the respective relative situation control actuator 110.1 since this allows a relatively reliable, error-tolerant determination of the adjustment information VI.

However, it is understood that the adjustment information VI can in general also be detected in any other suitable manner in other embodiments (in addition or as an alternative to the use of the adjustment sensors 110.3). Thus, for example, provision can be made for the control signals for the respective one relative situation control actuator 110.2 to be detected and stored without gaps in a history starting from the first initial state and for the adjustment information VI to be determined from this history of the control signals.

In certain embodiments, the control device 109 can optionally also include an imaging error detection device (not illustrated in more detail here), which produces at least one imaging error information IEI, which is representative for an imaging error of the imaging device. The control device 109 then derives the relative situation change information RSCI from the imaging error information IEI, for example on the basis of a change in the imaging error information IEI over time. These embodiments can use a known relationship between the imaging error of the imaging device and the static change in relative situation between the first supporting structure 111.1 and the second supporting structure 111.2 caused by creep or settling effects. Thus, certain changes in relative situation can cause characteristic imaging errors, which consequently have a characteristic fingerprint, which was determined in advance from theory and/or by simulation. These characteristic imaging errors or fingerprints can then be used to deduce an actual change in relative situation in the control device 109 during operation.

A relatively clear relationship between the imaging error and such a change in relative situation arises, for example, in the case of embodiments in which the optical imaging device 101 also includes passive optical components which are involved with the imaging but are not actively set by way of the relative situation control device 110, but instead are connected in a substantially rigid fashion to the first supporting structure 111.1 during operation, as indicated in FIG. 1 by the contour 107.3, which represents a stop. In this case, only the actively adjusted optical elements of the element group 107.1 are repositioned by the relative situation control device 110 to follow the change in relative situation while the passive components, such as the stop 107.3, remain in their relative situation thus yielding a change in relative situation between the components 107.1 and 107.3, which is accompanied by a characteristic imaging error.

In further embodiments, the control device 109 can additionally or alternatively include a relative situation detection device, as indicated in FIG. 2 by the contour 109.4. In this case, the relative situation detection device 109.4 generates at least one relative situation information RSI which is representative for the relative situation between the first supporting structure 111.1 and the second supporting structure 111.2 in at least one degree of freedom, the information being output to the control unit 109.2. The control device 109 then derives the relative situation change information RSCI from the relative situation information RSI, for example on the basis of a change in the relative situation information RSI over time. In this way, it is possible to realize relatively simple and precise detection of the relative situation change information RSCI.

While the above-described active embodiments each realize a closed-loop control circuit, embodiments with an open controlled system can also be realized, as mentioned above. Thus, in certain embodiments, the control device 109 can also use the change of state model CM of the supporting device 113 for ascertaining the relative situation change information RSCI, wherein the change of state model CM can be time-dependent for example (for example, in order to map ageing processes within the supporting device 113). In this case, the change of state model CM describes an (for example time-dependent) change in relative situation behavior of the supporting device 113. In the present example, the change of state model can use a creep model CM of the supporting spring device 113, wherein the creep model CM of the supporting spring device 113 describes the (optionally time-dependent) creep behavior of the supporting spring device 113. From this relative situation change behavior or creep behavior known with sufficient accuracy, the relative situation change information RSCI can possibly be determined without a further sensor system and can be used directly for the control. However, in some embodiments the change of state model or creep model CM can also be used for checking the plausibility of the relative situation change information RSCI, which was determined in another way, such as described above or below.

It should be mentioned again at this point that the embodiments described above or below for determining the relative situation change information RSCI can be, as a general matter, arbitrarily combined, for example in order to obtain consolidated (e.g., averaged) relative situation change information RSCI. In addition or as an alternative, individual embodiments for determining the relative situation change information RSCI can naturally also be used to check the plausibility of the results of the other embodiments for determining the relative situation change information RSCI.

In general, changing the magnetic supporting force MFT can furthermore be implemented at any suitable time or triggered by any temporal events (e.g., specifiable intervals) and/or non-temporal events (e.g., detected shock loads, reaching a certain number of imaging procedures, starting up or shutting down the imaging device 101, etc.).

In the present example, the control device 109 activates the creep compensation mode CCM if the relative situation change represented by the relative situation change information RSCI exceeds a specifiable limit value LIM (i.e., if the following applies: RSCI>LIM). As a result of this, it is naturally possible to react relatively efficiently and in needs-based fashion to the creep or settling effects.

Additionally or alternatively, the control device 109 can activate the creep compensation mode or compensation mode CCM, as mentioned, on the basis of specifiable events, for example at specifiable time intervals, wherein the creep compensation mode is activated, for example, at 0.25 to 10 years (e.g., 0.5 to 5 years, 1 to 2 years) following the first operation of the imaging device 101 and/or a preceding activation of the creep compensation mode CCM.

In general, the control device 109 can be designed in any suitable manner in order to realize a control of the relative situation control device 110 that is adapted to the respective optical imaging process of the imaging device 101. Here, it is possible to provide any suitable control bandwidths for controlling the relative situation control device 110. In some embodiments, the control device 109 has a control bandwidth of 10 Hz to 1000 Hz (e.g., 20 Hz to 500 Hz, 50 Hz to 300 Hz).

The degree of freedom or the degrees of freedom DOF in which, as a result of creep or settling effects, there is a change in relative situation which is relevant to the imaging process or the imaging errors thereof can be any degrees of freedom, up to all six degrees of freedom in space. Here, any suitable limit values can be specified, which, if exceeded, involve or prompt a change of the magnetic supporting force MFT.

In certain embodiments, the at least one degree of freedom DOF of the change in relative situation is a rotational degree of freedom, for example a rotational degree of freedom about a tilt axis extending transversely to the direction of gravity. The specifiable limit value then can be representative for a deviation of the relative situation between the first supporting structure 111.1 and the second supporting structure 111.2 from a specifiable relative target situation by 1 µrad to 500 µrad (e.g., 10 µrad to 300 µrad, 20 µrad to 100 µrad). In addition or as an alternative thereto, the at least one degree of freedom DOF of the change in relative situation can be a translational degree of freedom, for example a translational degree of freedom along the direction of gravity. The specifiable limit value then can be representative for a deviation of the relative situation between the first supporting structure 111.1 and the second supporting structure 111.2 from a specifiable relative target situation by 1 μm to 500 μm (e.g., 10 μm to 300 μm, 20 μm to 100 μm).

In general, the magnetic device 115.1 can be designed in any suitable way for generating the magnetic supporting force MFT. Optionally, the stiffness of the magnetic device 115.1 is naturally matched to the stiffness of the supporting spring devices 113.1 in order to obtain the desired decoupling effect of the vibration decoupling device 113 in the involved decoupling degrees of freedom. Optionally, the magnetic device 115.1 is designed in such a way that it supplies the smallest possible contribution to the stiffness of the support of the metrology frame 111.2 in these decoupling degrees of freedom, in which the vibration decoupling device 113 should provide decoupling. Optionally, the magnetic device 115.1 supplies substantially no contribution to the stiffness of the support of the metrology frame 111.2 in these decoupling degrees of freedom.

In general, the interplay between the supporting spring devices 113.1 and the magnetic device 115.1 can be designed in any suitable manner in order to obtain the desired vibration-decoupled support of the metrology frame 111.2. Thus, the magnetic device 115.1 can be configured in such a way that the magnetic supporting force MFT at least partly relieves the supporting spring devices 113.1 and the magnetic supporting force MFT is increased passively or actively for at least partial compensation of the change in relative situation, as will yet be described below in conjunction with FIGS. 4 and 6. Likewise, the magnetic device 115.1 can however also be configured in such a way that the magnetic supporting force MFT prestresses the supporting spring devices 113.1 and the magnetic supporting force MFT is reduced for at least partial compensation of the change in relative situation, as will yet be described below in conjunction with FIG. 5.

Figure 6:
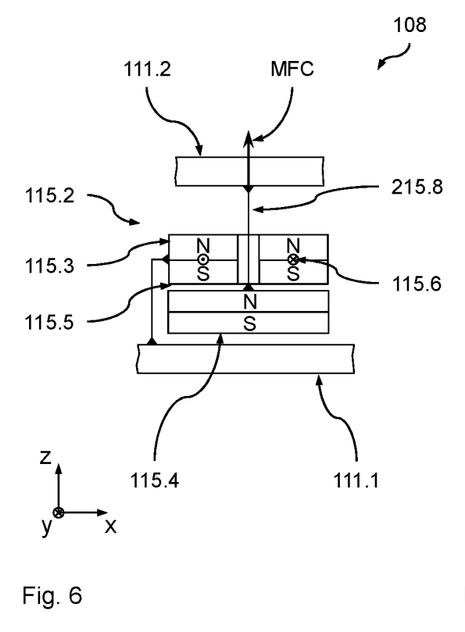
FIG. 6 is a schematic view of the part of an embodiment of the imaging device from FIG. 2.

In the embodiments of FIGS. 4 and 6, the magnetic device 115.1 for relieving the supporting spring devices 113.1 is configured in such a way that the magnetic supporting force MFT compensates at least a fraction of the overall weight of the metrology frame 111.2 and the components carried thereby (such as the measuring device 109.1). It can be desirable for this fraction is at least 0.5% to 20% (e.g., at least 1% to 15%, at least 2% to 5%) of the overall weight. It can be desirable, for example, if at least a majority of the weight is absorbed by the magnetic supporting force MFT, the supporting spring devices 113.1 hence being significantly relieved from the static loads and there also being reduced creep or settling effects on account of this relief.

In general, any suitable magnetic unit pairs 115.2 can be used to produce the magnetic supporting force MFT. In the examples described below in conjunction with FIGS. 4 to 7, the magnetic device 115.1 includes in each case a number of magnetic unit pairs 115.2 with two, in each case permanently magnetized magnetic units 115.3 and 115.4.

As described below initially on the basis of the embodiment of FIG. 4, the magnetic unit pair 115.2 includes a permanently magnetized first magnetic unit 115.3 and a permanently magnetized second magnetic unit 115.4, which are assigned to one another for contactless interaction, with an air gap 115.5 situated therebetween. Here, the first magnetic unit 115.3 is mechanically connected to the load-bearing first supporting structure 111.1 while the second magnetic unit 115.4 is mechanically connected to the metrology frame 111.2.

Here, in an active embodiment, the first magnetic unit 115.3 can include a schematically indicated coil unit 115.6, the coil unit, for the purposes of altering the magnetization of the first magnetic unit 115.3, being connectable to a voltage source (not illustrated) of the control device 109. With this, it is relatively easily possible to adapt the magnetic field strength of the first magnetic unit 115.3, and hence the magnetic force contribution MFC or, in total, the magnetic supporting force MFT, by way of appropriate control of the coil unit 115.6.

In the embodiment of FIG. 4, the magnetization of the first magnetic unit 115.3 and of the second magnetic unit 115.4 is chosen in such a way that the contribution MFC to the magnetic supporting force MFT results from mutual repulsion of the first magnetic unit 115.3 and the second magnetic unit 115.4. Thus, the first magnetic unit 115.3 and the second magnetic unit 115.4 attempt to increase the air gap 115.5 between the first magnetic unit 115.4 and the second magnetic unit 115.5.

Such an arrangement typically has a force profile in which, with a reduction of the air gap 115.5, the force contribution MFC of the magnetic unit pair 115.1 to the magnetic supporting force MFT over-proportionately increases, at least in sections, with an increasing change in relative situation. With this, a change in relative situation can be counteracted by a greatly increasing resistance by the force contribution MFC or the resultant magnetic supporting force MFT, and so the change in relative situation, which would otherwise result from creep or settling processes in the supporting spring devices 113.1, can be at least partly compensated or reduced, even in the case of the passive design of the magnetic unit pair 115.1. In the case of an active embodiment of the magnetic unit pair 115.1, it is even possible to re-establish the initial state by way of an appropriate control by way of the control unit 109.2.

In general, the magnetic unit pair 115.2 can be designed in such a way that it itself already provides the desired decoupling in the decoupling degrees of freedom involved (for the support of the second supporting structure 111.2). In the present example, the magnetic unit pair 115.2 is mechanically connected to the second supporting structure 111.2 via a decoupling device 115.8. Here, the decoupling device 115.8 is configured to generate at least partial mechanical decoupling between the magnetic unit pair 115.2 and the supporting structure 111.2 in a plurality of decoupling degrees of freedom that differ from the magnetic force direction of the force MFC. In the present example, a decoupling degree of freedom is a translational degree of freedom extending transversely to the magnetic force direction. Additionally, there is decoupling in a rotational degree of freedom about an axis which extends transversely to the magnetic force direction. A vibration decoupling can be obtained in a simple manner in all these cases.

To this end, the decoupling device 115.8 is configured as the flexible decoupling element that is elongated in the magnetic force direction, specifically as a leaf spring element that is elongated in the magnetic force direction or as a narrow, for example flexible rod spring element that is elongated in the magnetic force direction. The desired decoupling can be easily obtained in both cases.

In the embodiment of FIG. 4, the magnetic device 115.1 is configured in such a way that the magnetic supporting force MFT at least partly relieves the supporting spring devices 113.1 and the magnetic supporting force MFT is increased for at least partial compensation of the change in relative situation, as already described above.

Figure 5:
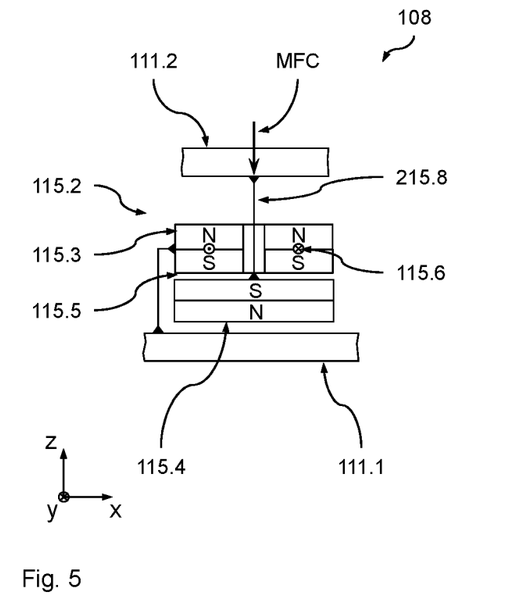
FIG. 5 is a schematic view of the part of an embodiment of the imaging device from FIG. 2.

In the embodiment of FIG. 5 described below, the magnetic device 115.1 is however configured in such a way that the magnetic supporting force MFT pre-stresses the supporting spring devices 113.1 and the magnetic supporting force MFT is decreased for at least partial compensation of the change in relative situation. In this case, in terms of basic design and functionality, the embodiment of FIG. 5 corresponds to the embodiment of FIG. 4, and so only differences shall be discussed here. Similar components have been provided with reference signs whose values have been increased by 100 and, provided nothing else is explicitly stated, express reference is made to the explanations relating to the embodiment of FIG. 4 with respect to the properties of these components.

The difference of the embodiment of FIG. 5 in relation to the embodiment of FIG. 4 consists in that the first magnetic unit 115.3 and the second magnetic unit 115.4 of the magnetic unit pair 215.2 have been arranged in reversed fashion (in comparison with the magnetic unit pair 115.2 of FIG. 4), and so the magnetic supporting force MFT prestresses the supporting spring devices 113.1 and the magnetic supporting force MFT is reduced for at least partial compensation of the change in relative situation. To this end, it was ultimately only the decoupling device 215.8 that was adapted accordingly.

The embodiment of FIG. 6 described below, in terms of its basic design, is similar to the embodiment of FIG. 5, and so only differences shall be discussed here. In the embodiment of FIG. 6, the magnetic device 115.1 is once again configured in such a way that the magnetic supporting force MFT relieves the supporting spring devices 113.1, with the second magnetic unit 115.4 having been turned around such that the magnetization of the first magnetic unit 115.3 and of the second magnetic unit 115.4 is chosen in such a way that the contribution MFC to the magnetic supporting force MFT emerges from a mutual attraction of the first magnetic unit 115.3 and the second magnetic unit 115.4. Thus, the first magnetic unit 315.3 and the second magnetic unit 315.4 attempt to reduce the air gap 115.5 between the first magnetic unit 115.4 and the second magnetic unit 115.5.

The difference of the embodiment of FIG. 6 from the embodiment of FIG. 5 consists in the fact that a compensation in the change in relative situation is only implemented actively by way of the coil unit 115.6, which, for the purposes of altering the magnetization of the first magnetic unit 115.3, is connectable to a voltage source (not illustrated) of the control device 109. With this, it is relatively easily possible to increase the magnetic field strength of the first magnetic unit 115.3, and hence the magnetic force contribution MFC or, in total, the magnetic supporting force MFT, by way of an appropriate control of the coil unit 115.6 in order to obtain a compensation.

A further embodiment is described below on the basis of FIG. 7. In terms of basic design and functionality, the embodiment of FIG. 7 corresponds to the embodiment of FIG. 4, and so only the differences shall be discussed here. Similar components have been provided with reference signs whose values have been increased by 200 and, provided nothing else is explicitly stated, express reference is made to the explanations relating to the embodiment of FIG. 4 with respect to the properties of these components.

Figure 7:
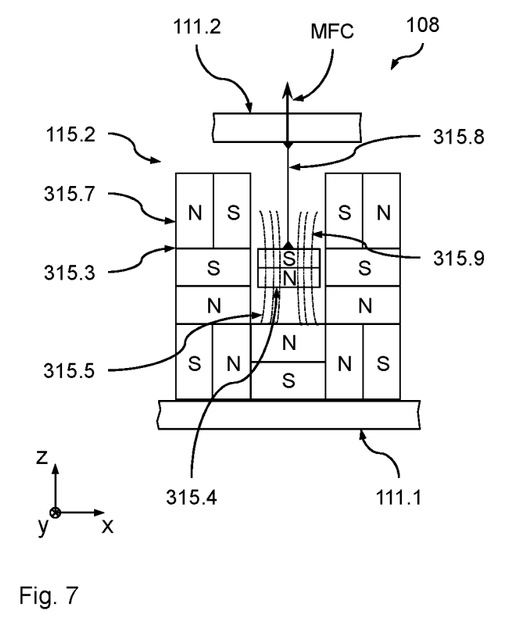
FIG. 7 is a schematic view of the part of an embodiment of the imaging device from FIG. 2.

The difference of the embodiment of FIG. 7 from the embodiment of FIG. 4 consists in the fact that the first magnetic unit 315.3 of the magnetic unit pair 115.2 is made of a plurality of magnetic elements 315.7 to have a cup-shaped design. Here, the respective magnetization is chosen in such a way that the magnetic field lines 315.9 superpose in such a way that the contribution MFC of the magnetic unit pair 115.2 to the magnetic supporting force MFT is virtually constant over a relatively long travel of the change in relative situation. In this case, the magnetic unit pair 115.2 then has a stiffness at least close to zero, which may be desirable from dynamic points of view since the dynamic vibration decoupling behavior then is, in this respect, defined primarily or even exclusively by way of the supporting spring devices 113.1.

It is understood that, in the case of a suitable superposition of the magnetic field lines 315.9, it is also possible to obtain virtually any other profile or course of the contribution MFC of the magnetic unit pair 115.2 to the magnetic supporting force MFT across the change in relative situation.

Furthermore, it is understood that, in general, the various magnetic unit pairs 115.2 (of FIGS. 4 to 7) can also be combined with one another as desired within the magnetic device 115. For example, the respective magnetic unit pair 115.2 can be specifically matched to the associated supporting spring device 113.1 and the creep behavior thereof or to the load situation thereof on account of the mass distribution of the supported second supporting structure 111.2.

Figure 8:
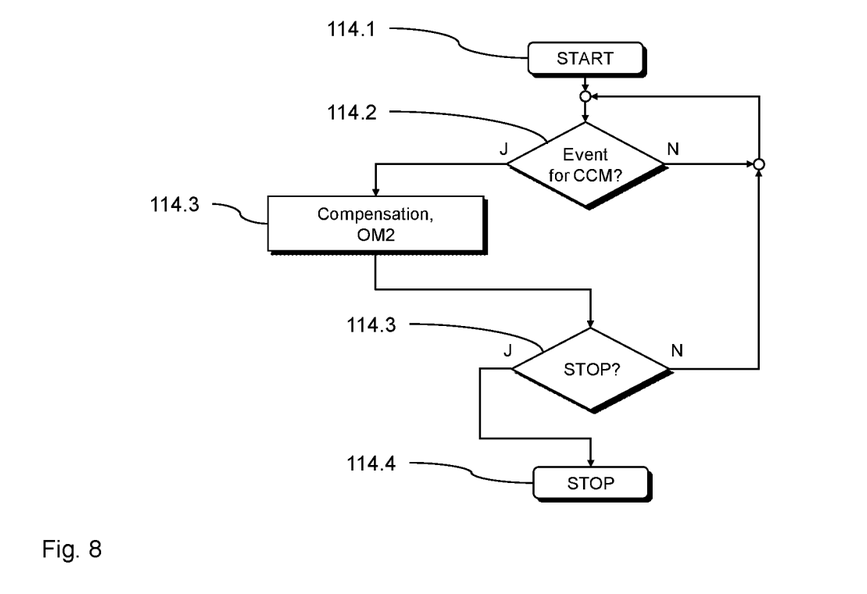
FIG. 8 is a flowchart of an exemplary embodiment of a method according to the disclosure, which can be carried out using the imaging device from FIG. 1.

Using the active designs described above, it is possible to perform the method according to the disclosure as described above. Here, as shown in FIG. 8, the procedure is initially started in a step 114.1. This is carried out, for example, with the first-time start-up of the imaging device 101, with the imaging device then being in the first operating state OM1.

Then, in a step 114.2, a check is carried out within the control device 109 as to whether one of the above-described events, which triggers the activation of the creep compensation mode CCM, has occurred. This check is repeated if this is not the case. However, if this is the case, the magnetic supporting force MFT is altered or adapted in the above-described manner in the control device 109 in a step 114.3, wherein the control device 109 then puts the imaging device 101 into the second operating state OM2 (which then replaces the first operating state OM1). Then, in a step 114.3, a check is carried out in the control device 109 as to whether the procedure should be terminated. If not, there is a jump back to the step 114.2. Otherwise, the procedure is terminated in a step 114.4. Beyond that, reference is made to the explanations above with respect to further details of the method so as to avoid repetition.

In the foregoing, the present disclosure was only described on the basis of examples in which the relative situation of each optical element of the element group 107.1 was actively adjusted in relation to the central reference 112. However, it is understood that in other embodiments only some of the optical elements (possibly even only one optical element) of the element group 107.1 can be actively adjusted directly in relation to the central reference 112 while the remaining optical elements of the element group 107.1 are actively adjusted relative to one of the optical elements that has been actively adjusted with respect to the central reference 112. For example, only one of the optical elements of the element group 107.1 can serve as a reference element and can be directly actively adjusted with respect to the central reference 112, while all other optical elements of the element group 107.1 are actively adjusted relative to this reference element (and hence only indirectly with respect to the central reference 112).

The present disclosure was described above exclusively on the basis of examples from the area of microlithography. However, it is understood that the disclosure can also be used in the context of any other optical applications, for example imaging methods at different wavelengths, in which similar problems arise with respect to the support of heavy optical units.

Furthermore, the disclosure can be used in connection with the inspection of objects, such as for example the so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place both substantially at the same wavelength as is used in the later microlithographic process. However, it is likewise possible also to use any desired wavelengths deviating therefrom for the inspection.

The present disclosure has been described above on the basis of specific exemplary embodiments showing specific combinations of the features. It should expressly be pointed out at this juncture that the subject matter of the present disclosure is not restricted to these combinations of features, rather all other combinations of features such as are evident from the following patent claims also belong to the subject matter of the present disclosure.

What is claimed is:

1. An arrangement, comprising:
    an optical element;
    a first supporting structure comprising a supporting device;
    a second supporting structure;
    a measuring device configured to measure a position and/or an orientation of the optical element in relation to a reference in from one to six degrees of freedom in space; and
    a reduction device configured to reduce a change in a static relative situation between the first and second supporting structures in at least one correction degree of freedom,
    wherein:
        the first supporting structure supports the optical element;
        the supporting device supports the second supporting structure;
        the second supporting structure supports the measuring device;
        the reduction device comprises a magnetic device configured to act kinematically parallel to the supporting device between the first and second supporting structures;
        the magnetic device is configured to exert a magnetic supporting force counteracting the change in the relative situation; and
        the arrangement is an arrangement of a microlithographic optical imaging device.

2. The arrangement of claim 1, further comprising a vibration decoupling device which comprises a plurality of supporting spring devices,
    wherein:
        the plurality of supporting spring devices support the second supporting structure;
        the plurality of supporting spring devices act kinematically parallel to one another between the first and second supporting structures;
        for each supporting spring device, the supporting spring device defines a supporting force direction along which the supporting spring device exerts a supporting force between the first and second supporting structures;
        for each supporting spring device, the supporting spring device defines a supporting length along the supporting force direction defined by the supporting spring device;
        the change in relative situation is due to a change in the length of a supporting spring device along its supporting force direction due to a creep process of the supporting spring device; and
        the magnetic device is configured to act kinematically parallel to the supporting spring devices between the first and second supporting structures.

3. The arrangement according of claim 1, wherein the magnetic device is configured to absorb at least 0.5% to 20% the overall weight of the second supporting structure and the components supported by the second supporting structure.

4. The arrangement according of claim 1, wherein the magnetic device comprises a magnetic unit pair comprising two magnetic units assigned to one another and configured to contactlessly interact in at least in the direction of the magnetic supporting force to generate the magnetic supporting force.

5. The arrangement according of claim 4, wherein at least one magnetic unit pair is spatially assigned to at least one supporting unit of the supporting device.

6. The arrangement according of claim 1, wherein at least one magnetic unit of the magnetic device comprises at least one permanent magnet.

7. The arrangement according of claim 1, wherein at least one of the following holds:
    the magnetic device is configured so that the magnetic supporting force proportionately increases, at least in sections, with increasing change in relative situation;
    the magnetic device is configured so that the magnetic supporting force over-proportionately increases, at least in sections, with increasing change in relative situation; and
    the magnetic device is configured so that the magnetic supporting force is substantially constant, at least in sections, with increasing change in relative situation.

8. The arrangement of claim 1, wherein:
    at least one magnetic unit of the magnetic device is configured to exert a magnetically generated supporting force on one of the supporting structures in a supporting force direction during operation;
    the at least one magnetic unit is mechanically connected to the supporting structure via a decoupling device; and
    the decoupling device is configured to generate at least partial mechanical decoupling between the magnetic unit and the supporting structure in at least one decoupling degree of freedom that differs from the supporting force direction.

9. The arrangement according of claim 1, wherein:
    at least one magnetic unit of the magnetic device is configured to exert a magnetically generated supporting force on one of the supporting structures in a supporting force direction during operation; and
    the at least one magnetic unit is mechanically connected to the supporting structure via a decoupling device extending in the supporting force direction.

10. The arrangement according of claim 1, further comprising a control device configured to control the magnetic device to change the magnetic supporting force based on a change in state of the supporting device along its supporting force direction.

11. The arrangement according of claim 1, further comprising a detection device and a control device, wherein:
    the detection device is configured to: i) detect at least one relative situation detection value which is representative for the relative situation between the first and second supporting structures in at least one correction degree of freedom; and ii) output the relative situation detection value to the control device; and the control device is configure to control the magnetic device to change the magnetic supporting force based on the relative situation detection value.

12. The arrangement according of claim 11, wherein the control device is configured to only control the magnetic device once a deviation of the relative situation detection value from a specifiable relative situation target value exceeds a specifiable limit value in the at least one correction degree of freedom.

13. An optical imaging device, comprising:
an illumination device comprising a first optical element group; and
a projection device comprising a second optical element group,
wherein:
the illumination device is configured to illuminate an object;
the projection device is configured to project an image of the object onto a substrate; and
at least one member selected from the group consisting of the illumination device and the projection device comprises an according to claim 1.

14. A method of using a microlithographic optical imaging device comprising an illumination device and a projection device, the illumination device comprising a first optical element group, and the projection device comprising a second optical element group, the method comprising:
using the illumination device to illuminate an object; and
using the projection device to project an image of the object onto a substrate,
wherein at least one member selected from the group consisting of the illumination device and the projection device comprises an according to claim 1.

15. A method of operating a microlithographic optical imaging device comprising a first supporting structure supporting a second supporting structure via a supporting device, the first supporting structure supporting an optical element of the imaging device, the second supporting structure supporting a measuring device configured to measure a position and/or an orientation of the optical element in relation to a reference in at least one degree of freedom up to all six degrees of freedom in space, the method comprising:
reducing, in at least one degree of freedom, a change in a static relative situation between the first and second supporting structures; and
exerting, in a manner kinematically parallel to the supporting device between the first and second supporting structures, a magnetically generated magnetic supporting force to counteract the change in relative situation that is exerted.

16. The method of claim 15, further comprising using the magnetic supporting force to support 0.5% to 20% of the overall weight of the second supporting structure and of the components supported by the second supporting structure.

17. The method of claim 15, further comprising using a magnetic unit pair to generate the magnetic supporting force, wherein the magnetic unit pair comprises two magnetic units assigned to one another and contactlessly interacting at least in the direction of the magnetic supporting force.

18. The method of claim 17, further comprising:
using at least one magnetic unit to exert a magnetically generated supporting force on one of the supporting structures in a supporting force direction, the at least one magnetic unit being mechanically connected to the supporting structure; and
implementing at least partial mechanical decoupling between the magnetic unit and the supporting structure in at least one decoupling degree of freedom that differs from the supporting force direction.

19. The method of claim 15, further comprising at least one of the following:
proportionally increasing, at least in sections, the magnetic supporting force with increasing change in relative situation;
over-proportionally increasing, at least in sections, the magnetic supporting force with increasing change in relative situation; and
keeping the magnetic supporting force substantially constant, at least in sections, with increasing change in relative situation.

20. The method of claim 15, further comprising altering the magnetic supporting force based on a change in state of the supporting device.

21. The method of claim 15, further comprising:
detecting at least one relative situation detection value representative for the relative situation between the first and second supporting structures in at least one correction degree of freedom is detected and
altering the magnetic supporting force based on the relative situation detection value.

22. The method of claim 21, further comprising altering the magnetic supporting force only when a deviation of the relative situation detection value from a specifiable relative situation target value exceeds a specifiable limit value in the at least one correction degree of freedom.

* * * * *

UNITED STATES PATENT AND TRADEMARK OFFICE
CERTIFICATE OF CORRECTION

PATENT NO. : 11,526,089 B2
APPLICATION NO. : 17/354204
DATED : December 13, 2022
INVENTOR(S) : Marwène Nefzi et al.

Page 1 of 1

It is certified that error appears in the above-identified patent and that said Letters Patent is hereby corrected as shown below:

In the Claims

Column 22, Line 8, Claim 3, delete "according".

Column 22, Line 12, Claim 4, delete "according".

Column 22, Line 18, Claim 5, delete "according".

Column 22, Line 21, Claim 6, delete "according".

Column 22, Line 24, Claim 7, delete "according".

Column 22, Line 48, Claim 9, delete "according".

Column 22, Line 56, Claim 10, delete "according".

Column 22, Line 61, Claim 11, delete "according".

Column 23, Line 6, Claim 12, delete "according".

Signed and Sealed this
Seventh Day of February, 2023

Katherine Kelly Vidal
*Director of the United States Patent and Trademark Office*